United States Patent
Shiimoto et al.

(10) Patent No.: US 8,369,128 B2
(45) Date of Patent: Feb. 5, 2013

(54) STORAGE DEVICE AND INFORMATION RERECORDING METHOD

(75) Inventors: Tsunenori Shiimoto, Kanagawa (JP); Tomohito Tsushima, Tokyo (JP); Shuichiro Yasuda, Kanagawa (JP)

(73) Assignee: Sony Corporation, Tokyo (JP)

( * ) Notice: Subject to any disclaimer, the term of this patent is extended or adjusted under 35 U.S.C. 154(b) by 67 days.

(21) Appl. No.: 12/747,832

(22) PCT Filed: Dec. 11, 2008

(86) PCT No.: PCT/JP2008/072488
§ 371 (c)(1), (2), (4) Date: Jun. 11, 2010

(87) PCT Pub. No.: WO2009/075315

PCT Pub. Date: Jun. 18, 2009

(65) Prior Publication Data
US 2011/0149635 A1 Jun. 23, 2011

(30) Foreign Application Priority Data
Dec. 12, 2007 (JP) .................... 2007-320578

(51) Int. Cl.
*G11C 11/00* (2006.01)
(52) U.S. Cl. .................... 365/148; 365/158
(58) Field of Classification Search .......... 365/148, 365/158
See application file for complete search history.

(56) References Cited

U.S. PATENT DOCUMENTS

| | | | |
|---|---|---|---|
| 6,995,999 B2 * | 2/2006 | Morimoto | 365/148 |
| 2004/0130929 A1 | 7/2004 | Tsang | |
| 2004/0174739 A1 | 9/2004 | Morimoto et al. | |
| 2006/0279983 A1 * | 12/2006 | Hachino et al. | 365/158 |
| 2007/0008770 A1 * | 1/2007 | Nagao et al. | 365/148 |
| 2007/0176264 A1 * | 8/2007 | Lee et al. | 257/614 |

FOREIGN PATENT DOCUMENTS

| | | |
|---|---|---|
| JP | 2004-185723 | 7/2004 |
| JP | 2004-185755 | 7/2004 |
| JP | 2006-202411 | 8/2006 |
| JP | 2007-018615 | 1/2007 |

OTHER PUBLICATIONS

International Search Report dated Feb. 20, 2009, for corresponding Patent Application PCT/JP2008/072488.
Nikkei Electronics; Jul. 16, 2007.

* cited by examiner

*Primary Examiner* — Anthan Tran
(74) *Attorney, Agent, or Firm* — K&L Gates LLP

(57) ABSTRACT

A storage device capable of decreasing the number of voltages necessitating control and decreasing peripheral circuit size is provided. A first pulse voltage (VBLR) is supplied from a first power source through a bit line BLR to an electrode of a variable resistive element. A second pulse voltage (VWL) for selecting a cell is supplied from a second power source through a word line WL to a control terminal of a transistor. A third pulse voltage (VBLT) is supplied from a third power source though a bit line BLT to a second input/output terminal of the transistor. At the time of rewriting information, the voltage value (VBLT) of the third power source is adjusted by an adjustment circuit. Thereby, a cell voltage and a cell current are changed (decreased or increased).

16 Claims, 7 Drawing Sheets

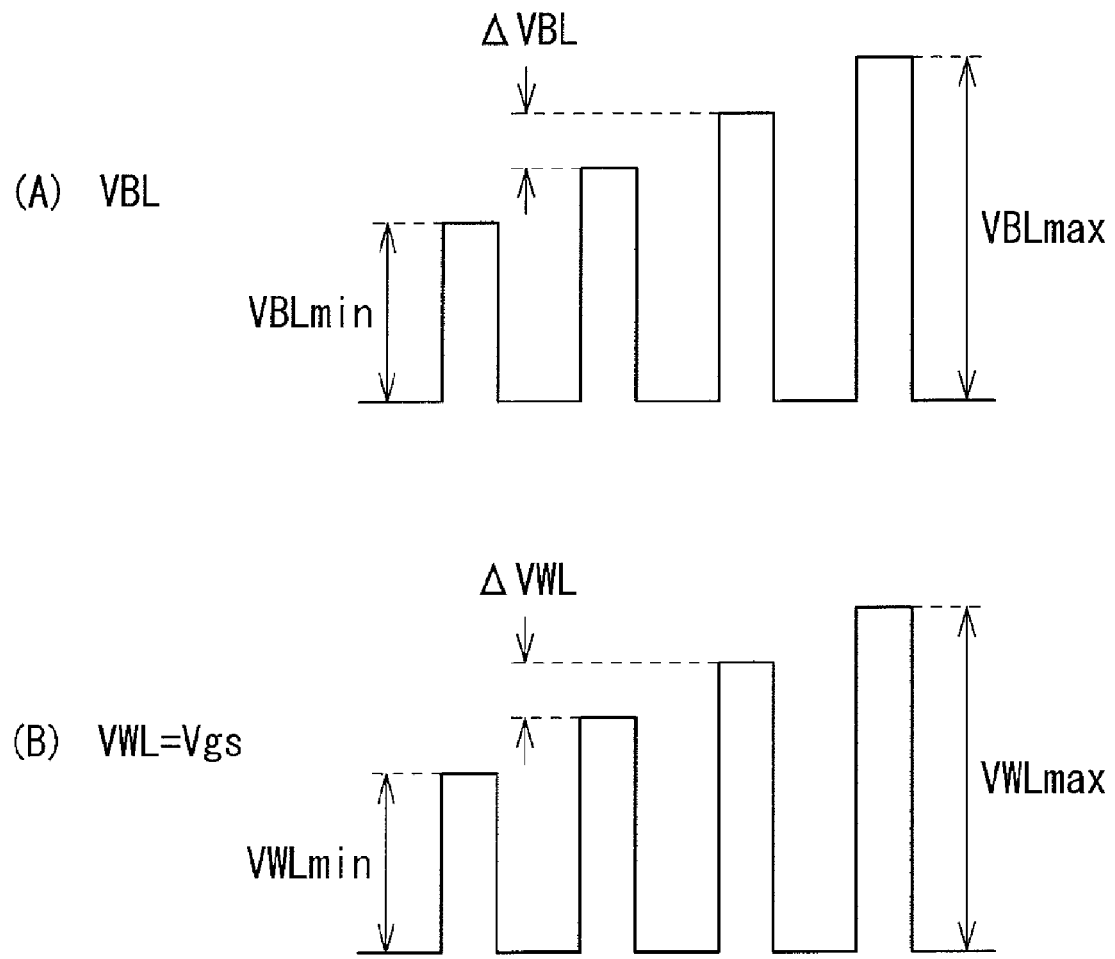
F I G. 12

STORAGE DEVICE AND INFORMATION RERECORDING METHOD

CROSS REFERENCE TO RELATED APPLICATIONS

The present application is a National Stage of International Application No. PCT/JP2008/072488 filed on Dec. 11, 2008 and which claims priority to Japanese Patent Application No. 2007-320578 filed on Dec. 12, 2007, the entire contents of which are being incorporated herein by reference.

BACKGROUND

The present disclosure relates to a storage device that includes a memory cell having a storage element and a switching element, and particularly to a storage device having a drive source for rerecording by verification control and an information rerecording method.

In information equipments such as a computer, a high density DRAM (Dynamic Random Access Memory) capable of high speed operation is widely used. However, in the DRAM, there is a problem that the manufacturing cost is high, since the manufacturing process is more complicated than that of a general logical circuit, a general signal processing circuit or the like used for electronic devices. Further, since the DRAM is a volatile memory in which information is not retained if the power is turned off, it is necessary to perform refresh operation frequently.

Thus, as a nonvolatile memory in which information is retained even if the power is turned off, for example, an FeRAM (Ferroelectric Random Access Memory), an MRAM (Magnetoresistive Random Access Memory) and the like have been proposed. In these memories, even if power is not supplied, written information is able to be retained for a long time. In addition, in these memories, it is not necessary to perform refresh operation, and thus power consumption is able to be decreased by just that much. However, there is a problem that miniaturization is not easy in the FeRAM, while there is a problem that a writing current is large in the MRAM (for example, Nonpatent Document 1).

Therefore, as a memory suitable for speeding up the data writing speed, for example, a new type storage device as illustrated in FIG. 9 and FIG. 10 has been proposed.

FIG. 9 illustrates a memory cell 100 of the storage device. The memory cell 100 includes a variable resistive element 110 whose cross sectional structure is illustrated in FIG. 10 and an MOS transistor 120 (switching element). The variable resistive element 110 is formed by layering an electrode 111, an ion source layer 112, a high resistive layer 113, and an electrode 114. The electrode 111 is electrically connected to a bit line BLR, and the electrode 114 is electrically connected to one terminal of the MOS transistor 120, respectively. The other terminal of the MOS transistor 120 is electrically connected to a bit line BLT, and a gate of the MOS transistor 120 is electrically connected to a word line WL, respectively.

In the storage device, when a voltage is applied to the electrode 114 and the electrode 111 so that a current is flown from the ion source layer 112 to the high resistive layer 113, state of the high resistive layer 113 is changed to low resistance, and data is written. By contraries, when a voltage is applied to the electrode 114 and the electrode 111 so that a current is flown from the high resistive layer 113 to the ion source layer 112, state of the high resistive layer 113 is changed to high resistance, and data is erased.

Compared to the existing nonvolatile memory or the like, the storage device has features that no element size dependence exists since the memory cell is able to be structured by a simple structure, and the storage device is good at scaling since a large signal is able to be obtained. Further, the storage device has advantages that data writing speed due to resistance change is able to be speeded up to, for example, about 5 nanoseconds, and the storage device is able to be operated by a low voltage (for example, about 1 V) and a low current (for example, about 20 µA).

Nonpatent document 1: Nikkei Electronics, issue date: Jul. 16, 2007, p. 98

However, in the foregoing storage device, when writing is performed by the existing method, the following problems occur. That is, in order to perform optimal writing into such a kind of storage device, it is necessary to control a voltage and a current applied to the variable resistive element 110 so that the voltage and the current fall within a given range. FIG. 11 illustrates an equivalent circuit at the time of writing thereof. Voltage control is performed by adjusting a voltage (VBLR) of the bit line BLR mainly by a VBLR adjustment circuit 121, and current control is performed by adjusting a voltage (VWL) of the word line WL mainly by a VWL adjustment circuit 122, respectively. As described above, for performing optimal writing by the existing method, the adjustment circuits for controlling two voltages are necessitated. It results in a factor to cause increase of peripheral circuit size.

Further, in some cases, controlling the foregoing VBL and the foregoing VWL is performed as default setting before shipment for every cell or for every block unit as a group composed of several cells. In some cases, adjustment is performed for every cell and for every writing operation. Examples of general techniques of the latter case include a method in which verification reading and rewriting are combined (hereinafter collectively and simply referred to as verification). That is, in such a method, verification reading is performed after writing operation. In the case of low resistance, it is determined that writing has succeeded and writing operation is finished. Meanwhile, in the case of high resistance, it is determined that writing has failed and rewriting is performed. Such a cycle is repeated until a certain upper limit number of cycles is completed.

If writing fails, it is prospective that optimal conditions of a voltage and a current have been changed to higher level. Thus, in the case where rewriting is performed, both voltages VBL and VWL are increased than in the precedent writing to improve writing success rate. To realize such complicated control, increase of the peripheral circuit is inevitable. However, as described above, in the existing technique, it is necessary to control two voltages, leading to further increase of peripheral circuit size.

In view of the foregoing problems, it is desirable to provide a storage device and an information rerecording method that decrease the number of voltages necessitating control and are able to decrease peripheral circuit size.

SUMMARY

A storage device of an embodiment includes: a storage element which has a pair of electrodes and into which information is recorded by applying a voltage to the electrodes; a switching element that has a first input/output terminal, a second input/output terminal and a control terminal, in which the first input/output terminal is connected to one of the electrodes of the storage element; a first power source supplying a first voltage to the other one of the electrodes of the storage element; a second power source supplying a second selection-use voltage to the control terminal of the switching element; and an adjustment means that includes a third power source supplying a third voltage to the second input/output terminal of the switching element, and that changes a voltage value of the third voltage in recording the information on the storage element. In an embodiment the storage element is a nonvolatile variable resistive element in which a resistance value thereof is reversibly changed by applying pulse voltages with different polarity between the electrodes.

In the storage device of the embodiment, a magnitude of the voltage applied to the second input/output terminal of the switching element is controlled by the adjustment means, and thereby both the voltage and a current applied to the storage element are increased or decreased.

An information rerecording method of an embodiment is an information rerecording method for performing verification operation to check whether or not information recording is correctly executed on a storage element and performing rerecording according to a result of the verification operation in a storage device having the storage element which has a pair of electrodes and on which the information is recorded by applying a voltage to the electrodes and a switching element that has a first input/output terminal, a second input/output terminal and a control terminal, in which the first input/output terminal is connected to one of the electrodes of the storage element. A magnitude of a voltage applied to the second input/output terminal of the switching element is changed every time when the rerecording is performed after the verification operation.

According to the storage device and the information rerecording method of the embodiment, when the voltage and the current applied to the storage element are changed, the magnitude of only the voltage applied to the second input/output terminal of the switching element is controlled. Thus, the voltage and the current applied to the storage element are able to be concurrently controlled only by controlling one voltage without changing the voltage value of the control terminal of the switching element. That is, the number of voltages to be controlled is able to be decreased, and peripheral circuit size is able to be decreased.

Additional features and advantages are described herein, and will be apparent from, the following Detailed Description and the figures.

BRIEF DESCRIPTION OF THE FIGURES

FIG. 12 is a waveform chart for explaining verification control.

DETAILED DESCRIPTION

Embodiments will be hereinafter described in detail with reference to the drawings.

First Embodiment

Figure 1:
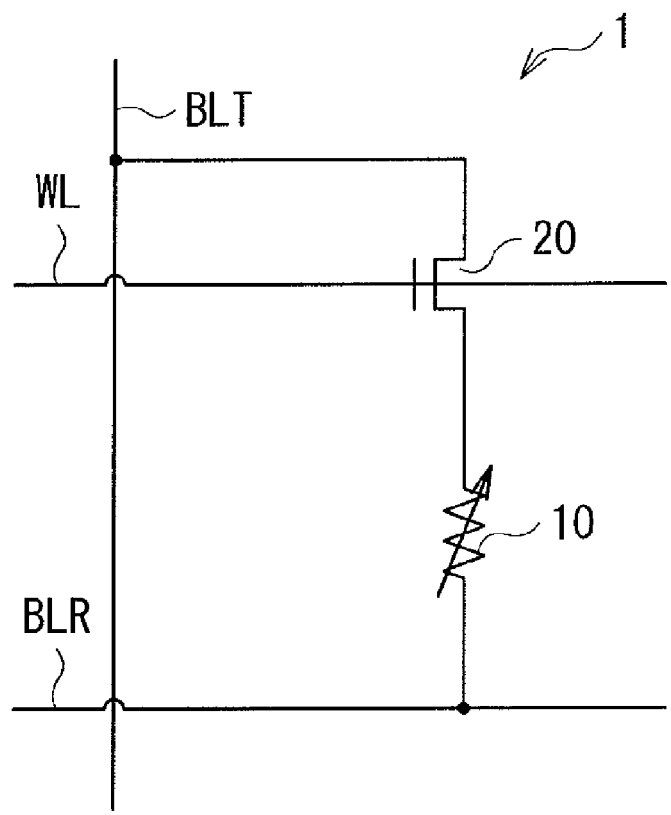
FIG. 1 is a circuit configuration diagram of a storage device (memory cell) according to an embodiment.
Figure 2:
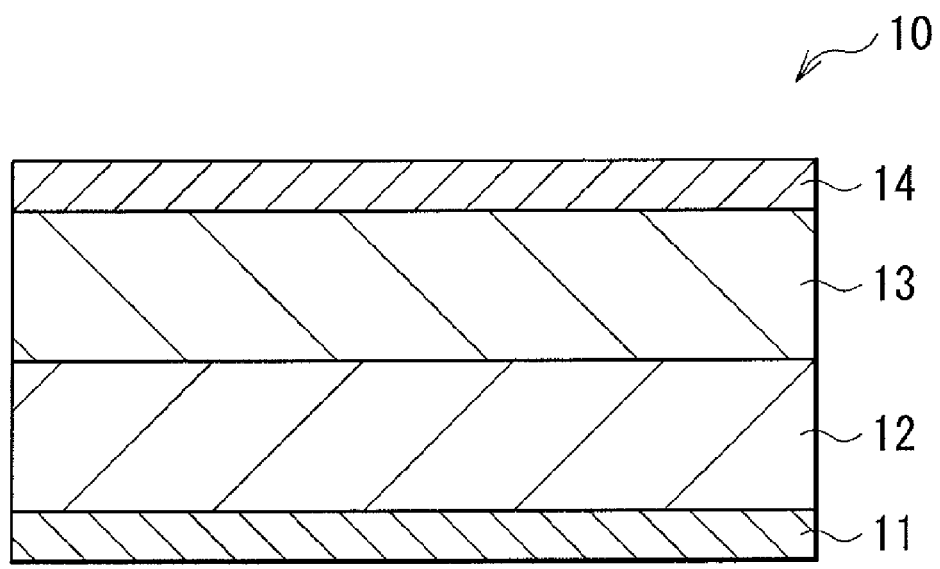
FIG. 2 is a cross sectional view illustrating a structure of the memory cell illustrated in FIG. 1.
Figure 3:
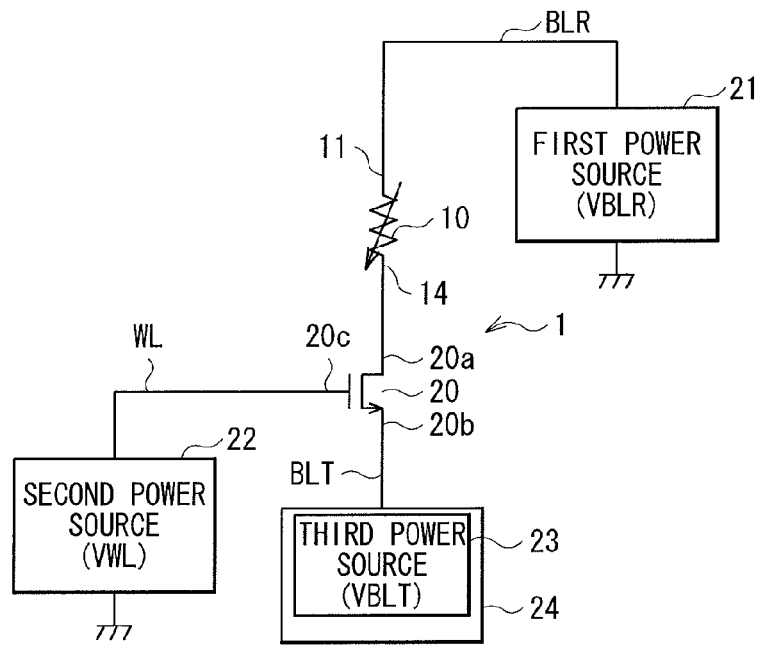
FIG. 3 is an equivalent circuit diagram at the time of information writing of the memory cell illustrated in FIG. 1.

FIG. 1 illustrates a memory cell 1 of a storage device according to a first embodiment. The memory cell 1 includes a storage element such as a variable resistive element 10 illustrated in FIG. 2 and an N channel MOS type transistor 20 as a switching element. In the storage device, a plurality of memory cells 1 as a storage unit are arranged in a state of matrix. FIG. 3 illustrates an equivalent circuit at the time of writing operation of the memory cell 1.

The variable resistive element 10 is formed, for example, by layering an electrode 11, an ion source layer 12, a high resistive layer (variable resistive layer), and an electrode 14.

The electrodes 11 and 14 are made of a metal material such as Al, Cu, and W. The high resistive layer 13 is made of a metal material, a rear earth element, an oxide or a nitride composed of a mixture thereof, or a semiconductor material, for example. As will be described later, the high resistive layer 13 has a function that the resistance value is changed according to the direction of electric field generated between the electrodes 11 and 14 by applying a voltage between the two electrodes 11 and 14 as described later.

The ion source layer 12 contains, for example, at least one kind of metal element out of Cu, Ag, and Al and at least one kind of chalcogen element out of Te, S, and Se. For example, the ion source layer 12 is composed of CuTeSi, GeSbTeSi, CuGeTeSi, AgGeTeSi, AgTeSi, AlTeSi, AlGeTeSi, ZrTeAl, CuZrTeAl, CuSSi, CuGeSSi, CuSeSi, CuGeSeSi or the like.

The foregoing Cu and the foregoing Ag are an element that is easily moved in the ion source layer 12 and the high resistive layer 13 when Cu and Ag become a cation. Te is an element that is able to realize a smaller resistance value of the ion source layer 12 than a resistance value of the high resistive layer 13 when the variable resistive element 10 is turned on. Thus, in the case where Te is used as a chalcogen element in the ion source layer 12, a section where the resistance value is largely changed is able to be limited to the high resistive layer 13, and stability of memory operation is able to be improved. Further, in the case where Cu is used as an element to become a cation and Te is used as a chalcogen element in the ion source layer 12, the resistance value of the ion source layer 12 is able to be sufficiently smaller than the resistance value of the high resistive layer 13 when the variable resistive element 10 is turned on. Thus, in this case, stability of memory operation is able to be further improved.

Further, the foregoing Al is an element forming a chemically stable oxide when the state of the variable resistive element 10 is changed from low resistance to high resistance. Thereby, retention characteristics of erasing state (high resistance state) are improved. Si is an element capable of realizing the amorphous ion source layer 12 and increasing crystallization temperature of the ion source layer 12. Thus, in the case where an appropriate amount of Si is contained in the ion source layer 12, state change such as crystallization due to heat generated at the time of process or the like is inhibited, and stability of memory operation is able to be improved.

The ion source layer 12 may further contain O (oxygen) such as TeAlZrOx. Thereby, retention characteristics at the time of writing data and controllability of resistance value are improved.

As illustrated in FIG. 3, the electrode 11 of the variable resistive element 10 is electrically connected to the bit line BLR, and the electrode 14 of the variable resistive element 10 is electrically connected to a first input/output terminal (drain/source) 20a of the transistor 20, respectively. A second input/output terminal (source/drain) 20b of the transistor 20 is electrically connected to the bit line BLT, and a control terminal 20c (gate terminal) of the transistor 20 is electrically connected to the word line WL, respectively.

A first pulse voltage (VBLR) is supplied from a first power source 21 through the bit line BLR to the electrode 11 of the variable resistive element 10. A second pulse voltage (VWL) for selecting a cell is supplied from a second power source 22 through the word line WL to the control terminal 20c of the transistor 20. A third pulse voltage (VBLT) is supplied from a third power source 23 though the bit line BLT to the second input/output terminal 20b of the transistor 20.

Here, in this embodiment, in the first power source 21 and the second power source 22, each writing voltage value (pulse height) is a constant fixed voltage source, while in the third power source 23, the voltage value is able to be changed by an adjustment circuit 24 (adjustment means). That is, at the time of writing information, the voltage value is able to be decreased or increased arbitrarily within the range where the second input/output terminal 20b of the transistor 20 works as a source. Specifically, for example, the third power source 23 has a structure including a plurality of writing-use DC power sources with different voltage values (pulse height), in which selection thereof is made by the adjustment circuit 24. The pulse voltage is not limited to the voltage having literally pulse waveform, but includes a voltage having a lamp-shaped pulse waveform.

Next, a description will be given of an operation of the storage device (memory cell 1) of this embodiment.

(Writing)

Negative electric potential (minus electric potential) is applied to the electrode 14 and positive electric potential (plus electric potential) is applied to the electrode 11 from the first power source 21 and the third power source 23, respectively, and thereby a current is flown from the ion source layer 12 to the high resistive layer 13. From the ion source layer 12, at least one metal element out of Cu, Ag, and Al is ionized, is diffused into the high resistive layer 13, is bonded to an electron and is precipitated on the electrode 14 side, or remains in a diffused state inside the high resistive layer 13. As a result, a current path containing large amounts of the foregoing metal element is formed inside the high resistive layer 13, or many defects due to the foregoing metal element are formed inside the high resistive layer 13, and the resistance value of the high resistive layer 13 is decreased. At this time, the resistance value of the ion source layer 12 is originally lower than the resistance value of the high resistive layer 13 before writing. Thus, as the resistance value of the high resistive layer 13 is decreased, the resistance value of the entire variable resistive element 10 is also decreased (that is, the variable resistive element 10 is turned on). The resistance of the entire variable resistive element 10 at this time becomes writing resistance. After that, when the electric potential applied to the electrodes 11 and 14 is set to zero, and the voltage applied to the variable resistive element 10 is set to zero, the resistance value of the variable resistive element 10 is kept low. As described above, writing of information is performed.

(Erasing)

Next, positive electric potential (plus electric potential) is applied to the electrode 14 and negative electric potential (minus electric potential) is applied to the electrode 11 from the first power source 21 and the third power source 23, respectively, and thereby a current is flown from the high resistive layer 13 to the ion source layer 12. The current path formed in the high resistive layer 13 or the foregoing metal element composing impurity level is ionized, which is moved in the high resistive layer 13 and is returned to the ion source layer 12 side. As a result, the current path or the defects disappear from inside of the high resistive layer 13, and the resistance value of the high resistive layer 13 increases. At this time, the resistance value of the ion source layer 12 is originally low. Thus, as the resistance value of the high resistive layer 13 is increased, the resistance value of the entire variable resistive element 10 is also increased (that is, the variable resistive element 10 is turned off). The resistance of the entire variable resistive element 10 at this time becomes erasing resistance. After that, when the electric potential applied to the electrodes 11 and 14 is set to zero, and the voltage applied to the variable resistive element 10 is set to zero, the resistance value of the variable resistive element 10 is kept high. As described above, the written information is erased.

By repeating the foregoing steps, writing of information into the variable resistive element 10 and erasing the written information are able to be repeatedly performed.

At this time, for example, in the case where the state in which the resistance of the entire variable resistive element 10 is writing resistance (low resistance state) corresponds to information "1," and the state in which the resistance of the entire variable resistive element 10 is erasing resistance (high resistance state) corresponds to information "0," the information of the variable resistive element 10 is able to be changed from "0" to "1" by applying negative electric potential to the electrode 14, and the information of the variable resistive element 10 is able to be changed from "1" to "0" by applying positive electric potential to the electrode 14.

Further, in the variable resistive element 10, a wide range of resistance value is able to be retained. For example, in the case where an erasing voltage in changing from low resistance to high resistance is controlled to create intermediate state between high resistance state and low resistance state, such a state is able to be stably retained. Thus, not only two values but also multiple values are able to be stored, which results in realizing a high capacity.

(Reading)

In the case where the information recorded as described above is read, negative electric potential is applied to the electrode 14 to the degree with which writing operation is not generated, and positive electric potential is applied to the electrode 11. Otherwise, by contraries, positive electric potential is applied to the electrode 14 to the degree with which erasing operation is not generated, and negative electric potential is applied to the electrode 11. Thereby, a current is flown to the ion source layer 12 and the high resistive layer 13. In the result, a slight current corresponding to the resistance value in writing state and the resistance value in erasing state is flown. The current value is detected by a sense amplifier arranged, for example, outside a memory cell array. Thereby, whether the variable resistance element 10 is in low resistance state ("1") or high resistance state ("0") is able to be determined.

As described above, the variable resistance element 10 of this embodiment has a simple structure in which the electrode 11, the ion source layer 12, the high resistive layer 13, and the electrode 14 are only layered. Thus, even in the case of miniaturization, information is able to be written and erased. In addition, even without supplying electric power, the resistance value of the high resistive layer 13 is able to be retained. Thus, information is able to be retained for a long time. Further, the resistance value of the high resistive layer 13 is not changed by reading, and it is not necessary to perform refresh operation, and thus power consumption is able to be decreased by just that much.

In addition, in the past, to realize complicated control such as verification, increase of the peripheral circuit has been inevitable. However, in this embodiment, the peripheral circuit size is able to be decreased. For such a point, a description will be given below.

(Verification)

As described above, in verification operation, after writing operation, reading (verification reading) is performed. If state of the variable resistance element 10 is low resistance, it is determined that writing has succeeded, and writing operation is finished. Meanwhile, if state of the variable resistance element 10 is high resistance, it is determined that writing has failed, and rewriting is performed. Such a cycle is repeated until a certain upper limit number of cycles is completed.

Figure 4:
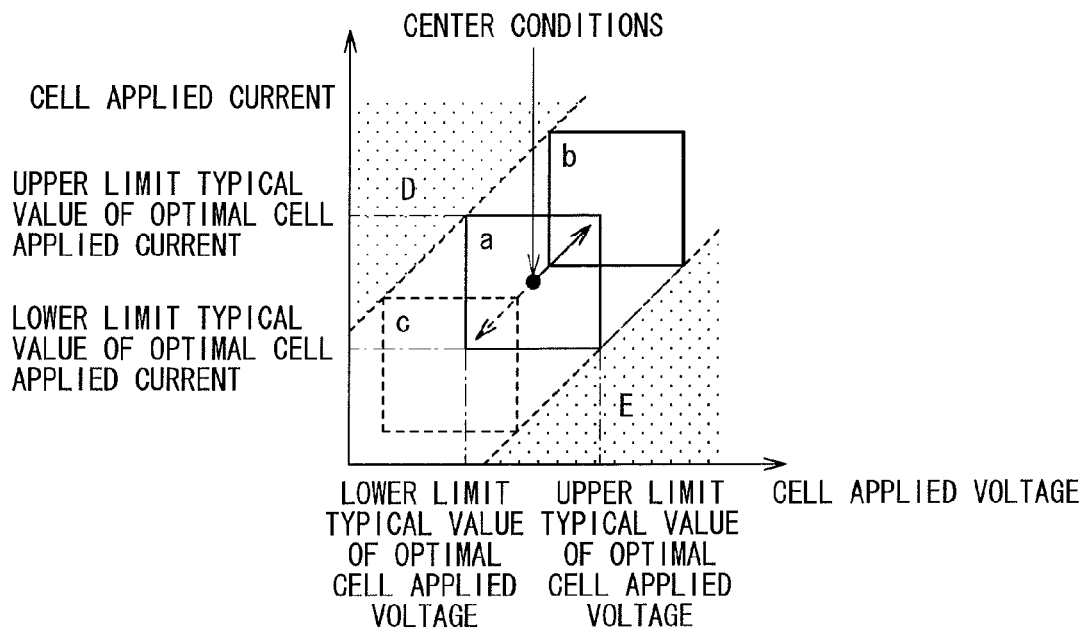
FIG. 4 is a characteristics diagram for explaining an optimal range of applied voltage and applied current.

FIG. 4 schematically illustrates an optimal range of applied voltage and applied current in the foregoing writing operation of the memory cell. In the figure, the cell applied voltage means a cell applied voltage at the initial time of writing operation in a state that the resistance value is high resistance, and the cell applied current means a cell applied current in a state that the resistance value is changed to low resistance. The optimal range of applied voltage and applied current is able to be schematically illustrated with the use of a rectangle surrounded by each upper limit and each lower limit. Region a represents a typical cell range, region b represents an example shifted upward, and region c represents an example shifted downward. Such shift may be generated resulting from variation among cells which is inherent in each cell, or may be generated resulting from characteristics change caused by repetition operation even in the case of the same cell. In the memory cell of this embodiment, it is often the case that in such shift, a voltage correlates with a current. Thus, a case that a voltage and a current are shifted to each region in a direction opposite to each other such as region D and region E hardly occurs.

In the case where the optimal range of applied voltage and applied current is shifted to the region b, as indicated by the arrow in solid line in the figure, it is necessary to perform writing by increasing both the cell applied voltage and the cell applied current than those of the center conditions. In the case where the optimal range of applied voltage and applied current is shifted to the region c, as indicated by the arrow in dashed line in the figure, it is necessary to perform rewriting by decreasing both the cell applied voltage and the cell applied current than those of the center conditions. A description will be hereinafter given of a method of rewriting in this embodiment while comparing to the existing method.

Figure 9:
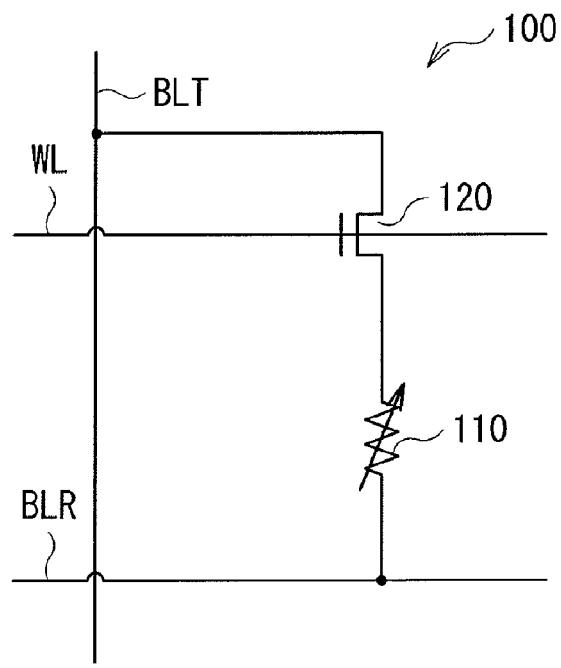
FIG. 9 is a circuit configuration diagram of an existing storage device (memory cell).
Figure 10:
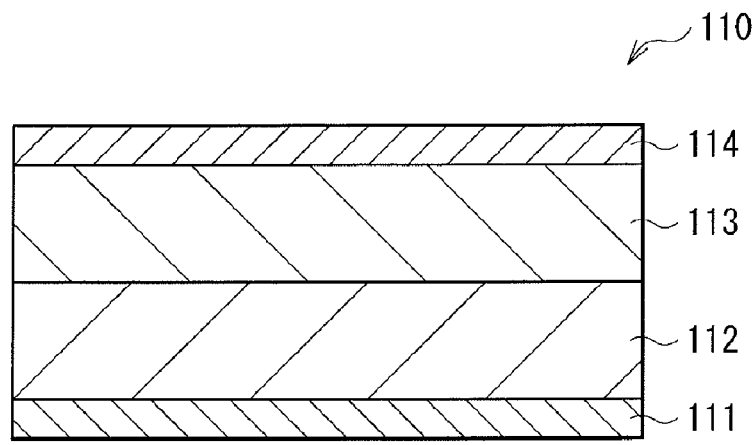
FIG. 10 is a cross sectional view illustrating a structure of the memory cell illustrated in FIG. 9.
Figure 11:
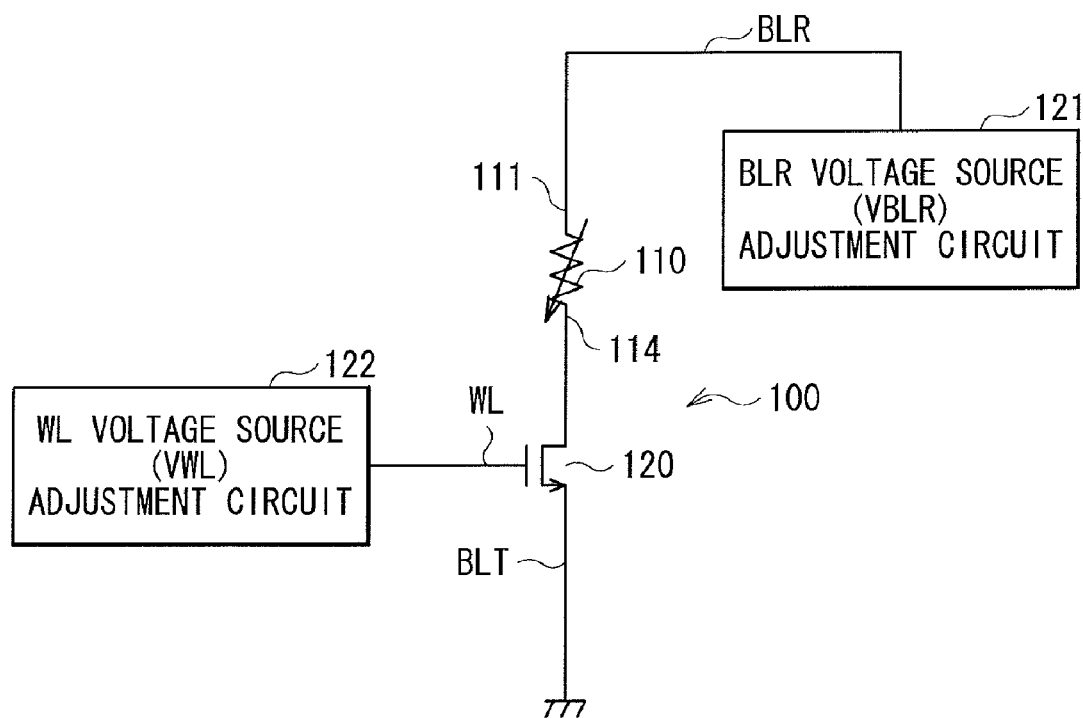
FIG. 11 is an equivalent circuit diagram at the time of information writing of the memory cell illustrated in FIG. 9.

First, in the existing memory cell 100 illustrated in FIG. 9, the cell applied voltage and the cell applied current are able to be respectively approximated as follows.

[Mathematical formula 1]

Cell applied voltage≈VBL  (1)

Cell applied current≈½·W/L μsCox(Vg−Vs−Vt)² =½·W/L μsCox(VWL−Vt)²  (2)

where W represents a channel width, L represents a channel length, μs represents carrier surface mobility, Cox represents a gate capacity per unit area, Vg represents a gate voltage, Vs (=0V) represents a source voltage, and Vt represents a threshold voltage. The cell applied voltage is VBL itself, and the cell applied current depends on VWL.

If writing fails, it is prospective that the optimal range of applied voltage and applied current have been changed to the region b of FIG. 4. Thus, in the case where rewriting is performed, as illustrated in FIGS. 12(A) and (B), both voltages VBL and VWL are increased than in the precedent writing to improve writing success rate. This is an example of verification performed under the conditions in which VBLmin (VWLmin) is the initial value, the number of upper limit of cycles is four, and voltage upper limit is VBL max (VWL max). The voltage is increased by ΔVBL (ΔVWL) every time. In the figure, verification reading is not illustrated. Verification reading is inserted after applying voltage pulse.

To realize such complicated control, increase of the peripheral circuit is inevitable. However, in the existing technique, it is necessary to control the two voltages VWL and VBL, leading to a problem of further increase of peripheral circuit size.

Meanwhile, in this embodiment, the two voltages VWL and VBLR are fixed values, and only VBLT is able to be changed. Thereby, both the cell applied voltage and the cell applied current are able to be changed.

FIG. 3 described above illustrates the equivalent circuit at the time of writing operation. The voltage value (VBLT) of the third power source 23 is set within a voltage range where the second input/output terminal 20b of the transistor 20 works as a source. Among VWL, VBLR, and VBLT, the voltage range is set so that VBLT becomes the lowest electric potential.

In the equivalent circuit of FIG. 3, the cell applied voltage and the cell applied current are able to be respectively approximated as follows.

[Mathematical formula 2]

Cell applied voltage≈VBLR−VBLT  (3)

Cell applied current≈½·W/L μsCox(Vg−Vs−Vt)²=½·W/L μsCox(VWL−VBLT−Vt)²  (4)

where W represents a channel width, L represents a channel length, us represents carrier surface mobility, Cox represents a gate capacity per unit area, Vg represents a gate voltage, Vs represents a source voltage, and Vt represents a threshold voltage.

As evidenced by the foregoing approximation formula, it is found that even if the two voltages VWL and VBLR are fixed values, by controlling only VBLT, both the cell applied voltage and the cell applied current are able to be controlled.

In the case where the optimal range of applied voltage and applied current is shifted to the region b in FIG. 4, in this embodiment, as indicated by the arrow in solid line in the figure, writing is performed by concurrently increasing both the cell applied voltage and the cell applied current by decreasing only VBLT. In the case where the optimal range of applied voltage and applied current is shifted to the region c, as indicated by the arrow in dashed line in the figure, writing is performed by concurrently decreasing both the cell applied voltage and the cell applied current than those of the center conditions by increasing only VBLT.

Figure 5:
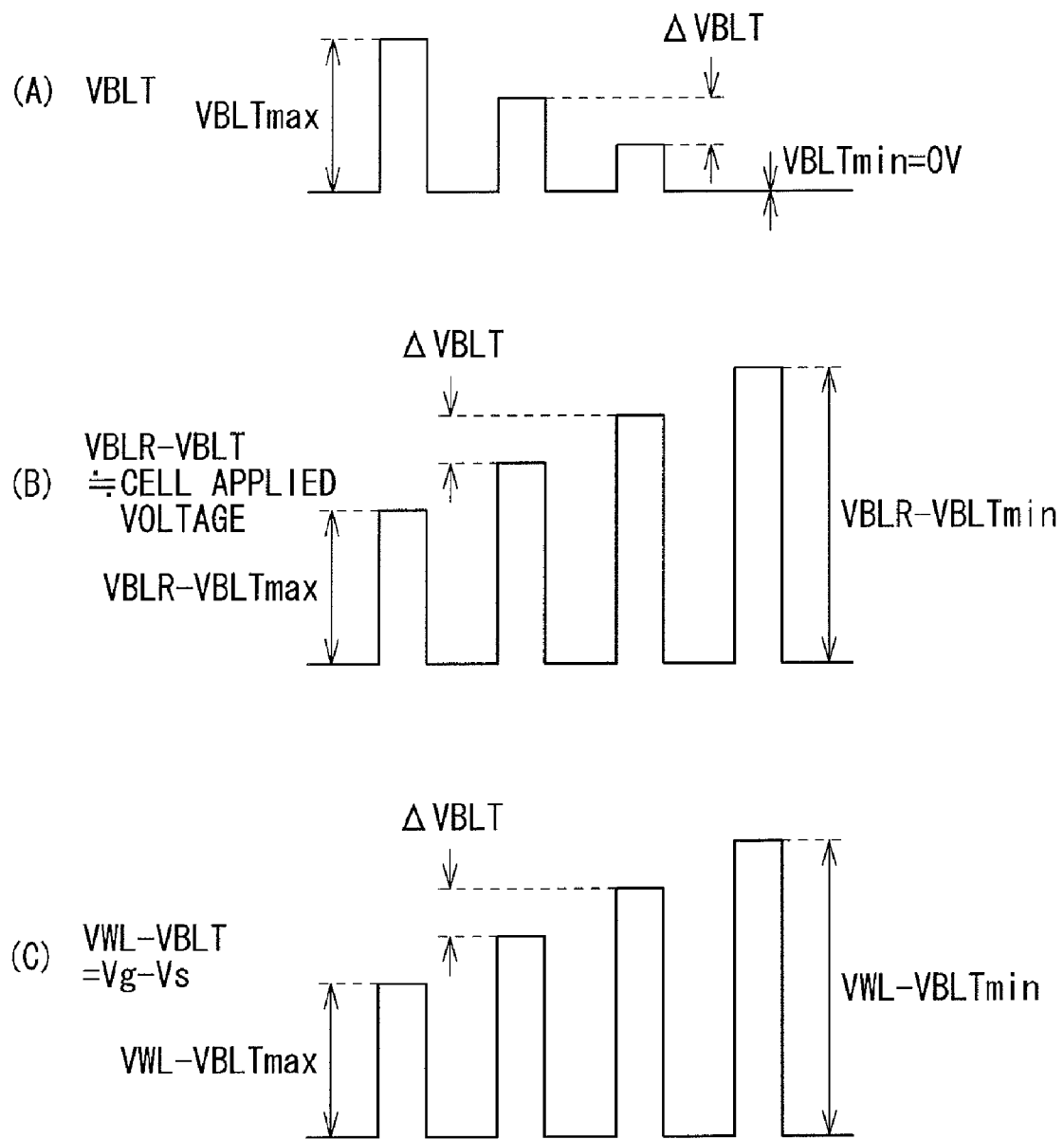
FIG. 5 is a waveform chart for explaining verification control.

FIG. 5 illustrates a schematic view of an example of verification control in this embodiment. FIG. 5(A) illustrates VBLT, FIG. 5(B) illustrates VBLT-VBLT (cell applied voltage), and FIG. 5(C) illustrates VWL-VBLT (=Vg−Vs), respectively. After writing operation, verification reading is performed. In the case of low resistance, it is determined that writing has succeeded, and writing operation is finished. Meanwhile, in the case of high resistance, it is determined that writing has failed, and rewriting is performed. Such a cycle is repeated until a certain upper limit number of cycles is completed.

If writing fails, it is prospective that the optimal range of applied voltage and applied current have been changed to the region b of FIG. 4. Thus, in the case where rewriting is performed, as illustrated in FIG. 5(A), the voltage VBLT is decreased than in the precedent writing and thereby writing voltage and writing current are concurrently increased in equivalent fashion to improve writing success rate. This is an example of verification performed under the conditions in which VBLTmax is the initial value, the number of upper limit of cycles is four, and voltage lower limit VBLmin is 0 V. In this embodiment, the voltage is increased by ΔVBLT every time. In the figure, verification reading is not illustrated. Verification reading is inserted after applying voltage pulse.

As described above, in this embodiment, the cell applied voltage and the cell applied current are able to be concurrently controlled by controlling only VBLT. Thus, complicated control is not necessitated, and the peripheral circuit configuration is able to be simplified.

A description will be given of another embodiment. For the same elements as those of the first embodiment, the description thereof will be omitted, and a description will be given of only a different point.

Second Embodiment

Figure 6:
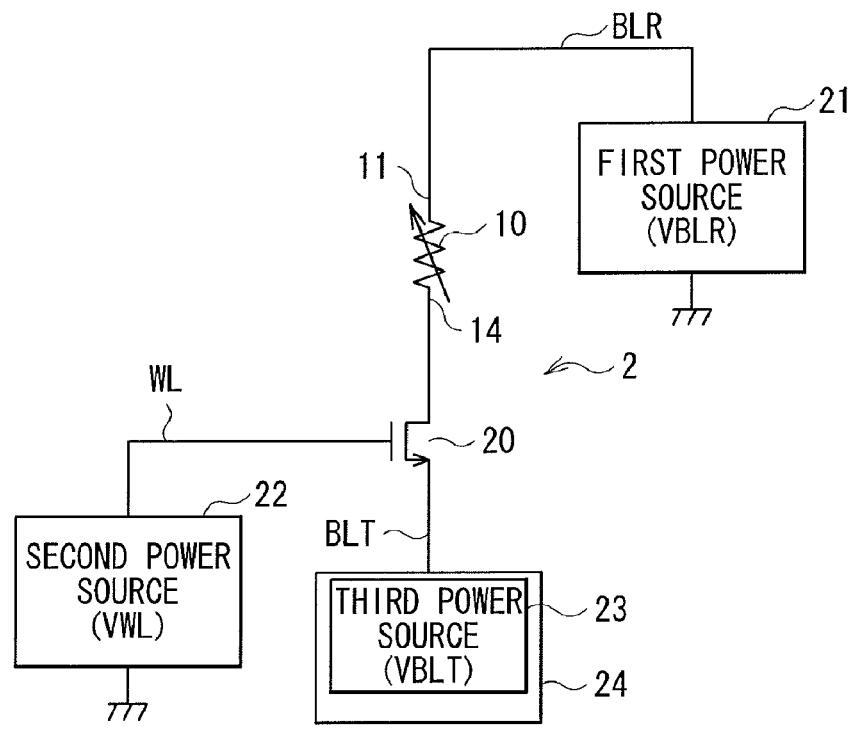
FIG. 6 is an equivalent circuit diagram at the time of information erasing of a memory cell according to another embodiment.

FIG. 6 illustrates an equivalent circuit at the time of erasing operation of a memory cell 2 in which the connection of the variable resistive element 10 of FIG. 3 is reversed. In this case, current flow in the variable resistive element 10 is opposite to that of the case at the time of writing (FIG. 3). Here, the cell applied voltage is a voltage in a state after the resistance value is changed to high resistance. The cell applied current is redefined as a cell applied current at the initial time of erasing operation in a state that the resistance value is low resistance state yet. Other points are similar to those of the first embodiment (FIG. 3), and the cell applied voltage and the cell applied current are able to be concurrently controlled by controlling only the third power source 23 (VBLT).

Modified Example

In the memory cells 1 and 2 described above, the NMOS transistor 20 is used. However, as in a memory cell 3 and a memory cell 4 illustrated in FIG. 7 and FIG. 8, a PMOS transistor 30 may be used.

Figure 7:
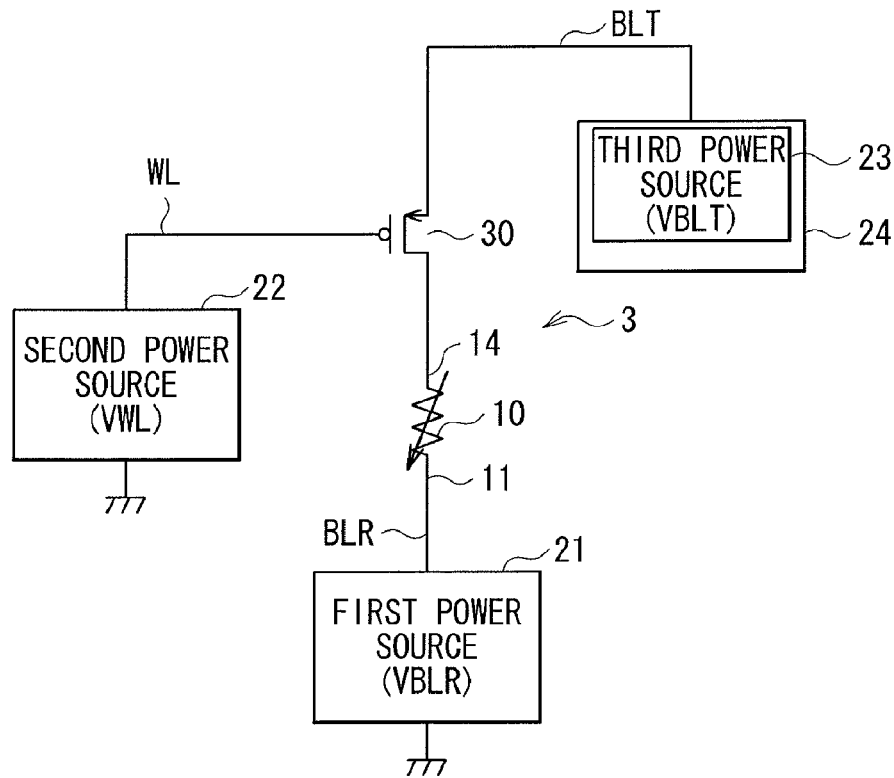
FIG. 7 is an equivalent circuit diagram at the time of information writing of a memory cell according to a modified example.

FIG. 7 illustrates an equivalent circuit at the time of writing operation of the memory cell 3. The voltage setting of VBLT is set within a voltage range where the bit line BLT of the transistor 30 works as a source terminal. That is, among VWL, VBLR, and VBLT, the voltage range is set so that VBLT becomes the highest electric potential. In this embodiment, the two voltages VWL and VBLR are fixed values, and only VBLT is controlled as well. The cell applied voltage is able to be approximated as follows.

[Mathematical formula 3]

Cell applied voltage≈VBLT−VBLR           (5)

Other points are similar to those of FIG. 3, and the cell applied voltage and the cell applied current are able to be concurrently controlled by controlling only VBLT.

Figure 8:
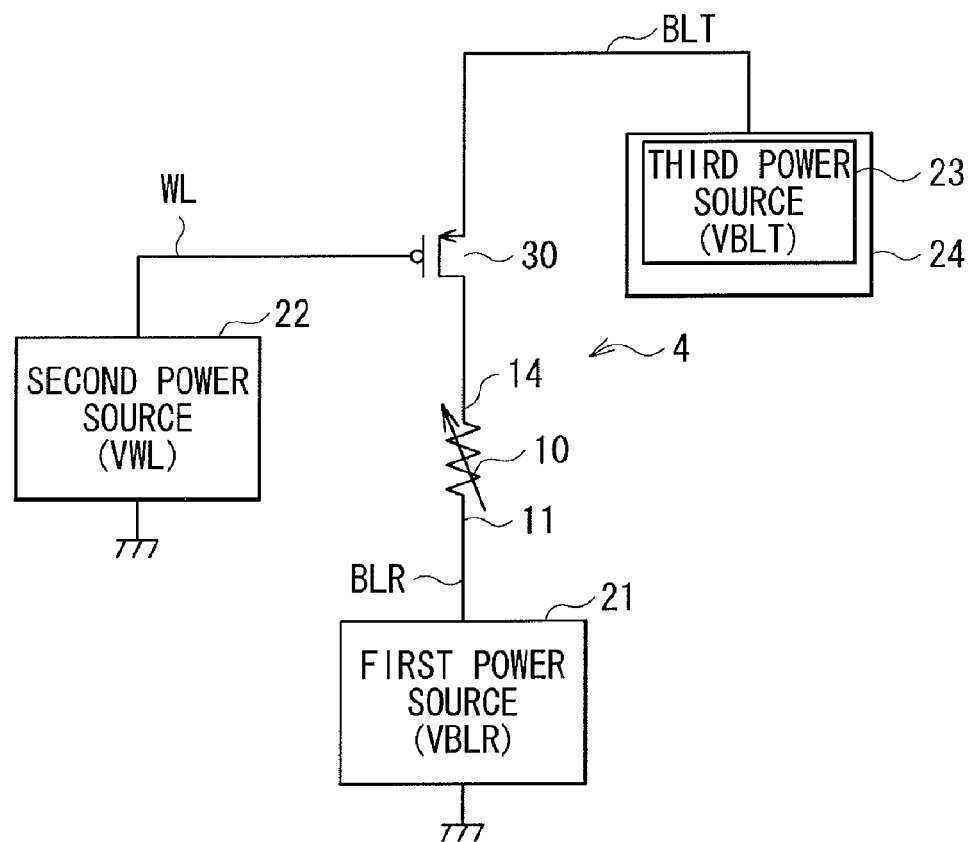
FIG. 8 is an equivalent circuit diagram at the time of information erasing of the memory cell according to the modified example.

FIG. 8 illustrates an equivalent circuit at the time of erasing operation of the memory cell 4 in which its current flow of the variable resistive element 10 is opposite to that of FIG. 7. In this case, the cell applied voltage is a voltage in a state after the resistance value is changed to high resistance, and the cell applied current is redefined as a cell applied current at the initial time of erasing operation in a state that the resistance value is low resistance yet. Other points are similar to those of FIG. 7, and the cell applied voltage and the cell applied current are able to be concurrently controlled by controlling only VBLT.

In the foregoing embodiments, the description has been given of verification control. However, the embodiment is able to be applied to not only the verification control, but also individual control of a writing voltage.

Further, in the foregoing embodiments, the description has been given of the memory cell (so-called 1T-1R type memory cell) in which one variable resistive element 10 is connected to one selected transistor. However, the embodiment is applicable to a memory cell in which a plurality of variable resistive elements 10 are connected to one selected transistor.

Further, the structure of the variable resistive element 10 is not limited to the structure of the foregoing embodiments. Other structure such as a structure in which lamination order of the ion source layer 12 and the high resistive layer 13 is reversed in the cross sectional structure of FIG. 2, a structure in which instead of providing the ion source layer 12, the metal element used for the ion source layer 12 is contained in the high resistive layer 13, and a structure in which the metal element used for the ion source layer 12 is contained in an electrode and the electrode also functions as the ion source layer 12 may be used. The present invention is applicable to any storage device using such a variable resistive element.

Further, the storage element is not limited to the variable resistive element 10, but other element such as a phase-change memory is able to be used. A storage device using such a memory may be configured.

Further, as a switching element, any switching element having two input/output terminals and a control terminal may be used. In addition to the MOS transistor, a bipolar transistor may be applied.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. A storage device comprising:
 a storage element including a pair of electrodes and into which information is recorded by applying a voltage to the electrodes;
 a switching element that has a first input/output terminal, a second input/output terminal and a control terminal, in which the first input/output terminal is connected to one of the electrodes of the storage element;
 a first power source supplying a first voltage to the other one of the electrodes of the storage element;
 a second power source supplying a second selection-use voltage to the control terminal of the switching element; and
 an adjustment means that includes a third power source supplying a third voltage to the second input/output terminal of the switching element, the third power source configured to supply the third voltage as at least three different voltage values in recording the information on the storage element, wherein the adjustment means selects a voltage value of the third voltage from among the at least three different voltage values.

2. The storage device according to claim 1, wherein the storage element is a nonvolatile variable resistive element in which a resistance value thereof is reversibly changed by applying pulse voltages with different polarity between the electrodes.

3. The storage device according to claim 2, wherein the switching element is an MOS transistor, and
the adjustment means decreases or increases the voltage value of the third voltage within a range where the second input/output terminal of the MOS transistor works as a source terminal in recording the information on the variable resistive element.

4. The storage device according to claim 3, wherein the adjustment means changes the voltage value of the third voltage, every time when rerecording is performed, according to a result of a verification operation to check whether or not information recording is correctly executed on the storage element.

5. The storage device according to claim 4, wherein voltage values of the first voltage and the second voltage are not changed.

6. The storage device according to claim 2, wherein the storage element further has a high resistive layer, and an ion source layer being contacted with the high resistive layer and containing a metal element that is easily ionized, between the electrodes.

7. The storage device according to claim 2, wherein the storage element has a high resistive layer between the electrodes, and a metal element that is easily ionized is contained in the high resistive layer.

8. The storage device according to claim 6, wherein the metal element is at least one element selected from the group consisting of Cu, Ag, and Al.

9. The storage device according to claim 6, wherein at least one element selected from the group consisting of S, Se, Te, and O is contained in a layer contacted with the high resistive layer or in the high resistive layer.

10. The storage device according to claim 6, wherein in the case where the pulse voltage is applied between the electrodes, the ionized metal element is moved from the ion source layer into the high resistive layer, and thereby resistance of the storage element is decreased.

11. The storage device according to claim 1, wherein the adjustment means decreases the third voltage causing a current and a voltage applied to the storage element to be increased to record the information on the storage element.

12. The storage device according to claim 1, wherein the adjustment means increases the third voltage causing a current and a voltage applied to the storage element to be decreased to record the information on the storage element.

13. The storage device according to claim 1, wherein a voltage range is between a low voltage value and a high voltage value, the low voltage value corresponding to a point where the third voltage has a lowest potential among the first and second voltages and the high voltage value corresponding to a point where the third voltage has a highest potential among the first and second voltages.

14. The storage device according to claim 1, wherein the adjustment means enables information recorded in the storage element to include an intermediate resistance value corresponding to a value between a high resistance state and a low resistance state of the storage element.

15. The storage device according to claim 1, wherein a cell applied voltage and a cell applied current are concurrently controlled by controlling only the third voltage.

16. The storage device according to claim 1, wherein the first power source and the second power source each have a fixed writing voltage value, and the third power source is configured to arbitrary change a writing voltage between the at least three different voltage values.

* * * * *